United States Patent
Miki et al.

(10) Patent No.: US 9,654,135 B2
(45) Date of Patent: May 16, 2017

(54) AD CONVERTER INCLUDING A CAPACITIVE DAC

(71) Applicant: Panasonic Intellectual Property Management Co., Ltd., Osaka (JP)

(72) Inventors: Takuji Miki, Osaka (JP); Kazuo Matsukawa, Osaka (JP)

(73) Assignee: PANASONIC INTELLECTUAL PROPERTY MANAGEMENT CO. LTD., Osaka (JP)

( * ) Notice: Subject to any disclaimer, the term of this patent is extended or adjusted under 35 U.S.C. 154(b) by 0 days.

(21) Appl. No.: 15/160,010

(22) Filed: May 20, 2016

(65) Prior Publication Data

US 2016/0352351 A1 Dec. 1, 2016

(30) Foreign Application Priority Data

May 27, 2015 (JP) ................. 2015-107392

(51) Int. Cl.
*H03M 1/38* (2006.01)
*H03M 1/46* (2006.01)
*H03M 1/06* (2006.01)

(52) U.S. Cl.
CPC ......... *H03M 1/468* (2013.01); *H03M 1/0626* (2013.01); *H03M 1/0665* (2013.01)

(58) Field of Classification Search
CPC ........ H03M 1/46; H03M 1/468; H03M 1/462; H03M 1/466
USPC ................. 341/155, 144, 163, 172
See application file for complete search history.

(56) References Cited

U.S. PATENT DOCUMENTS

| | | | |
|---|---|---|---|
| 9,444,489 B2* | 9/2016 | Roh .................... | H03M 3/39 |
| 2004/0034499 A1* | 2/2004 | Regier ................. | H03M 1/145 |
| | | | 702/127 |
| 2008/0062022 A1* | 3/2008 | Melanson ............ | H03M 3/464 |
| | | | 341/143 |
| 2015/0022387 A1* | 1/2015 | Chang .................. | H03M 3/30 |
| | | | 341/143 |
| 2015/0102209 A1* | 4/2015 | Xu ....................... | G01J 1/44 |
| | | | 250/214 LS |

OTHER PUBLICATIONS

Jeffrey. A. Fredenburg et al., "A 90-MS/s 11-MHz-Bandwidth 62-dB SNDR Noise-Shaping SAR ADC" IEEE J. Solid-State Circuits, vol. 47, No. 12, pp. 2898-2904, Dec. 2012.

* cited by examiner

*Primary Examiner* — Peguy Jean Pierre
(74) *Attorney, Agent, or Firm* — McDermott Will & Emery LLP

(57) ABSTRACT

An AD converter converts an analogue input voltage into a digital value including a most significant bit to a least significant bit. The AD converter includes: a common node; a capacitive DAC; a comparator; a successive approximation controller; and an integrator. The integrator includes first to $X^{th}$ integrating circuits connected in a cascade arrangement, where X is an integer greater than or equal to two, and at least one feedforward path that each samples a residual voltage and outputs the sampled residual voltage to one of the second to $X^{th}$ integrating circuits.

9 Claims, 13 Drawing Sheets

AD CONVERTER INCLUDING A CAPACITIVE DAC

BACKGROUND

1. Technical Field

The present disclosure relates to an AD converter including a capacitive DAC.

2. Description of the Related Art

As a technique for achieving as high resolution as that of a delta sigma AD converter while maintaining the low-power consumption performance of a successive approximation AD converter, a noise-shaping successive approximation AD converter has been proposed (for example, see J. A. Fredenburg, M. P. Flynn, "A 90-MS/s 11-MHz-Bandwidth 62-dB SNDR Noise-Shaping SAR ADC," *IEEE J. Solid-State Circuits*, vol. 47, no. 12, pp. 2898-2904, December, 2012.). The noise-shaping successive approximation AD converter includes a conventional successive approximation AD converter and an integrating circuit added to the conventional successive approximation AD converter. The noise-shaping successive approximation AD converter can obtain a noise-shaping characteristic by integrating the residual voltage of a capacitive DAC after an successive approximation operation has been performed down to the LSB and feeding back the integrated value for the next sampling.

SUMMARY

One non-limiting and exemplary embodiment provides an AD converter that can achieve higher resolution.

In one general aspect, the techniques disclosed here feature an AD converter for converting an analogue input voltage into a digital value including a most significant bit to a least significant bit. The AD converter includes: a common node; a capacitive DAC; a comparator; a successive approximation controller; and an integrator. The integrator includes first to $X^{th}$ integrating circuits connected in a cascade arrangement, where X is an integer greater than or equal to two, and at least one feedforward path that each samples a residual voltage and outputs the sampled residual voltage to one of the second to $X^{th}$ integrating circuits.

The AD converter of the present disclosure can achieve higher resolution.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
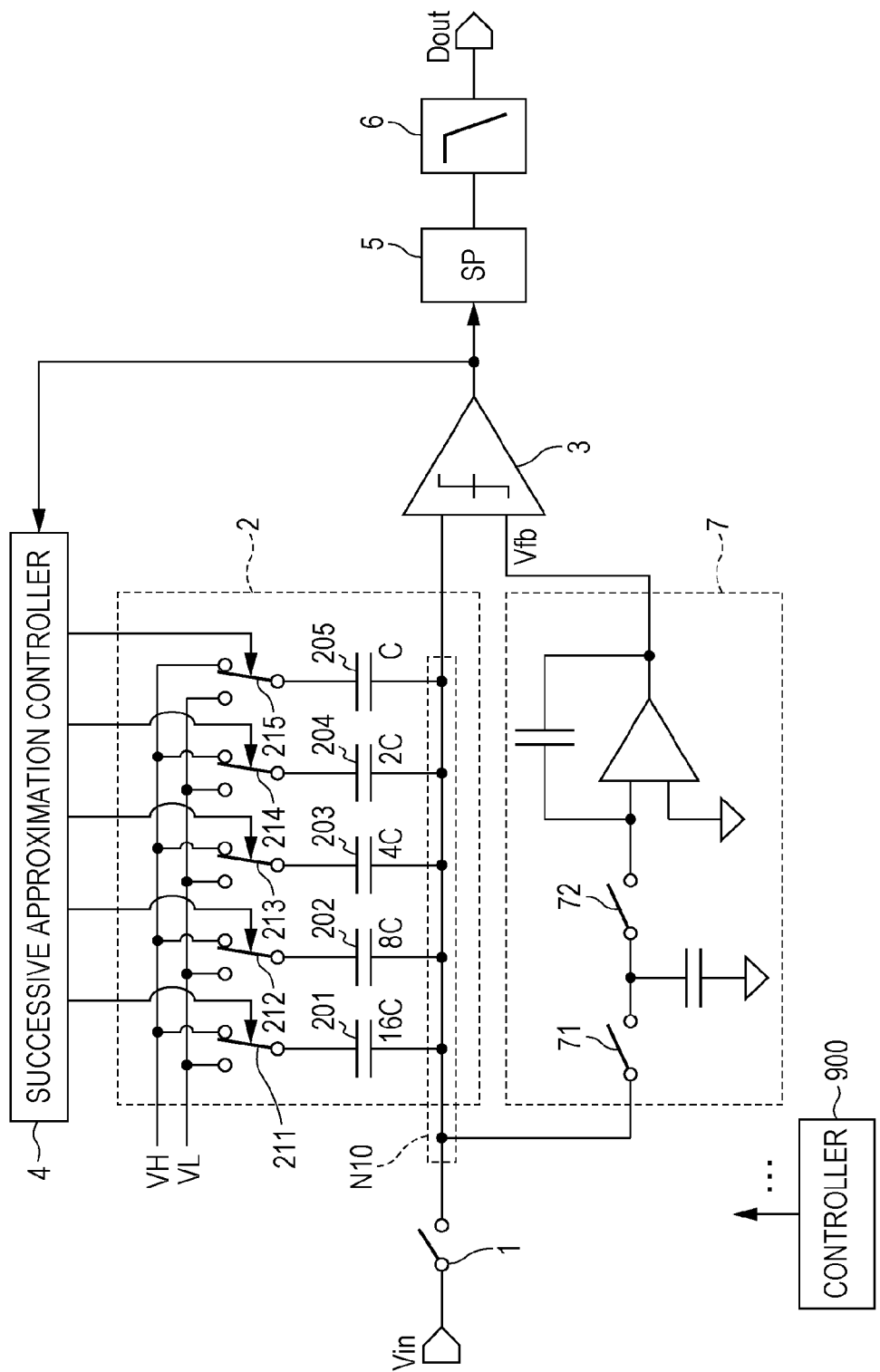
FIG. 1 is a diagram showing an example of a configuration of an AD converter according to a comparative example of the present disclosure.

Underlying Knowledge Forming Basis of the Present Disclosure

At an analog front end of a sensor system that deals with faint signals such as biological signals, an increase in resolution of an AD converter brings about advantageous effects. Examples of such effects include the relaxation of the amplification factor of an analog amplifier provided in front of the AD converter and the elimination of the need for the analog amplifier per se. However, in general, an increase in resolution of an AD converter requires noise reduction and therefore makes an increase in power consumption unavoidable. In anticipation of further reductions in size and power consumption of sensor systems in the future, there is a demand for low-power operations in high-resolution AD converters.

There are various architectures of AD converter, and these AD converters are properly used depending on the required specifications. A successive approximation AD converter obtains a multibit digital signal by successively repeating, from the most significant bit, a comparison operation between an analog input voltage and a voltage generated by a digital-to-analog converter (hereinafter referred to as "DAC"). As such, this architecture can be constituted only by a comparator, a DAC, and a simple digital circuit, and is most capable of achieving reductions in size and power consumption. However, the successive approximation AD converter is susceptible to the effect of thermal noise during comparison, because the comparison target voltage becomes lower as the resolution becomes higher. As such, the successive approximation AD converter has been considered to be unsuitable to a sensor system that requires high resolution.

Meanwhile, as another architecture of AD converter, there is a delta sigma AD converter. The delta sigma AD converter has an architecture that achieves higher resolution by combining a noise-shaping technique and an oversampling technique. The noise-shaping technique is a technique for performing delta sigma modulation to give quantization noise a frequency characteristic whose low-frequency side is attenuated. The delta sigma AD converter achieves a higher S/N ratio by sampling (oversampling) an analog input voltage at a frequency that is sufficiently higher than a signal band and blocking high-frequency noise with a low-pass filter (LPF). However, in order to achieve high resolution, it is necessary to increase the order of delta sigma modulation and, furthermore, increase the oversampling ratio. An increase in the order causes an increase in the number of integrating circuits in a delta sigma modulator, and an increase in the oversampling ratio requires an operation at a higher speed. Usually, an operational amplifier is used in an integrating circuit. Therefore, an increase in the number of integrators and a high-speed operation invite a great increase in power consumption.

In view of this, as mentioned above, the noise-shaping successive approximation AD converter described in J. A. Fredenburg, M. P. Flynn, "A 90-MS/s 11-MHz-Bandwidth 62-dB SNDR Noise-Shaping SAR ADC," *IEEE J. Solid-State Circuits*, vol. 47, no. 12, pp. 2898-2904, December, 2012. has been proposed. The noise-shaping successive approximation AD converter can obtain a noise-shaping characteristic by integrating the residual voltage of a capacitive DAC after a successive approximation operation has been performed down to the LSB and feeding back the integrated value for the next sampling.

However, the noise-shaping successive approximation AD converter described in J. A. Fredenburg, M. P. Flynn, "A 90-MS/s 11-MHz-Bandwidth 62-dB SNDR Noise-Shaping SAR ADC," *IEEE J. Solid-State Circuits*, vol. 47, no. 12, pp. 2898-2904, December, 2012. cannot be expected to bring about a great increase in resolution, as the order of noise shaping is a first order. Further, an operational amplifier used in an integrator needs to be always in operation, thus inviting an increase in power consumption.

Further, an important issue concerning an increase in resolution of the successive approximation AD converter is a capacitance mismatch of a DAC, as well as thermal noise. Conventionally, such mismatches have been improved by using capacitance trimming techniques. However, since most of the trimming techniques have discrete resolution, the trimming accuracy becomes lower as the resolution becomes higher.

In view of these problems, the present disclosure provide a successive approximation AD converter that achieves higher resolution by reducing noise such as quantization noise and thermal noise or that achieves higher resolution by suppressing spurious that is generated by a capacitance mismatch of a DAC. Further, the present disclosure provides a successive approximation AD converter that can reduce power consumption.

An AD converter according to a first aspect of the present disclosure is an AD converter for converting an analogue input voltage into a digital value including a most significant bit to a least significant bit, the AD converter comprising:

a common node to which the analog input voltage is inputted;

a capacitive DAC including capacitors each having a first end connected to the common node and a second end that is selectively connected to either a first or second voltage in accordance with a successive approximation control signal for a bit of the digital value;

a comparator that compares a voltage of the common node with a comparison reference voltage to determine the bit;

a successive approximation controller that determines a successive approximation control signal for a next bit in accordance with a result of comparison by the comparator; and an integrator that receives a residual voltage of the capacitive DAC via the common node after a the comparator has performed comparison of the most significant bit to the least significant bit, integrates the received residual voltage, and sets an integrated value as a comparison reference voltage for conversion of a next analog input voltage, wherein the integrator includes first to $X^{th}$ integrating circuits connected in a cascade arrangement, where X is an integer greater than or equal to two, and at least one feedforward path that each samples the residual voltage and outputs the sampled residual voltage to one of the second to $X^{th}$ integrating circuits.

According to this configuration, the integrator integrates the residual voltage of the capacitive DAC after the successive approximation operation has been performed from the MSB (most significant bit) down to the LSB (least significant bit) and feeds back the integrated value as the comparison reference voltage for the next sampling.

Since the integrator includes the first to $X^{th}$ integrating circuit connected in a cascade arrangement, the integrator can perform second- or higher-order integration on the residual voltage. Furthermore, since the residual voltage is supplied via the at least one feedforward path to at least one of the second to $X^{th}$ integrating circuits, this integrating circuit can integrate the integrated value of the preceding integrating circuit and the residual voltage.

With this, the residual voltage is given a high-order noise-shaping characteristic and added to the analog input voltage that is to be sampled next. As a result, the analog input voltage can be given a high-order noise-shaping characteristic. This makes it possible to provide a high-resolution successive approximation AD converter by oversampling the analog input voltage.

Further, in the AD converter according to the first aspect, the integrator may include at least one feedback path that each feeds back an integrated value of one of second to $X^{th}$ integrating circuits to a preceding integrating circuit.

According to this configuration, each of the at least one feedback path causes the integrated value of the subsequent integrating circuit to be fed back to the preceding integrating circuit. This allows a noise reduction region in the noise-shaping characteristic to be extended to a high-frequency side, thus making it possible to extend the frequency band of the analog input voltage Vin that can be inputted to the high-frequency side.

Further, in the AD converter according to the first aspect, each of the integrating circuits may include an operational amplifier that is activated only during integration operations.

According to this configuration, the operational amplifier of each of the integrating circuits is activated only when the integration operations are performed. This makes it possible to achieve a reduction in power consumption.

Further, an AD converter according to a second aspect of the present disclosure is an AD converter for converting an analogue input voltage into a digital value including a most significant bit to a least significant bit, the AD converter comprising:

a common node to which the analog input voltage is inputted;

a capacitive DAC including capacitors each having a first end connected to the common node and a second end that is selectively connected to either a first or second voltage in accordance with a successive approximation control signal for a bit of the digital value;

a comparator that compares a voltage of the common node with a comparison reference voltage to determine the bit;

a successive approximation controller that determines a successive approximation control signal for a next bit in accordance with a result of comparison by the comparator; and an integrator that receives a residual voltage of the capacitive DAC via the common node after the comparator has performed comparison of the most significant bit to the least significant bit, integrates the received residual voltage, and sets an integrated value as a comparison reference voltage for conversion of a next analog input voltage, wherein the integrator includes an integrating circuit that includes an operational amplifier and performs first to $X^{th}$ stages of an integration operation by sharing the integration circuit, where X is an integer greater than or equal to two, and at least one feedforward path that each samples the residual voltage and outputs the sampled residual voltage to the integrating circuit when the integrating circuit performs one of the second to $X^{th}$ stages of the integration operation According to this configuration, the integrator integrates the residual voltage of the capacitive DAC after the successive approximation operation has been performed from the MSB (most significant bit) down to the LSB (least significant bit) and feeds back the integrated value as the comparison reference voltage for the next sampling.

Since the integrator includes the integrating circuit that performs the first to $X^{th}$ stages of the integration operation by sharing the integration circuit, the integrator can perform second- or higher-order integration on the residual voltage. Furthermore, since the residual voltage is supplied via the at least one feedforward path to the integrating circuit when the integrating circuit performs at least one of the second to $X^{th}$ stages of the integration operation, this integrating circuit can integrate the integrated value of the preceding integrating circuit and the residual voltage.

With this, the residual voltage is given a high-order noise-shaping characteristic and added to the analog input voltage that is to be sampled next. As a result, the analog input voltage can be given a high-order noise-shaping characteristic. This makes it possible to provide a high-resolution successive approximation AD converter by oversampling the analog input voltage.

Furthermore, in the second aspect, the integrating circuit can be achieved with one operational amplifier, as the integrating circuit performs multiple stages of integration operation be sharing the operational amplifier.

Further, in the AD converter according to the second aspect, the integrator may include a feedback path that feeds back an integrated value of a first integration operation to the integrating circuit when the integrating circuit performs a second integration operation immediately following the first integration operation.

According to this configuration, the feedback path causes the integrated value of the first integration operation to be fed back when the integrating circuit performs the second integration operation immediately following the first integration operation. This allows a noise reduction region in the noise-shaping characteristic to be extended to a high-frequency side, thus making it possible to extend the frequency band of the analog input voltage Vin that can be inputted to the high-frequency side.

Further, in the AD converter according to the second aspect, the operation amplifier may be activated only during integration operations.

According to this configuration, the operational amplifier is activated only when the integration operations are performed. This makes it possible to achieve a reduction in power consumption.

Further, an AD converter according to a third aspect of the present disclosure is an AD converter for converting an analogue input voltage into a digital value including a most significant bit to a least significant bit, the AD converter comprising:

a common node to which the analog input voltage is inputted;

a capacitive DAC including capacitors each having a first end connected to the common node and a second end that is selectively connected to either a first or second voltage in accordance with a successive approximation control signal for a bit of the digital value, the second voltage being lower than the first voltage;

a comparator that compares a voltage of the common node with a comparison reference voltage to determine the bit;

a successive approximation controller that determines a successive approximation control signal for a next bit in accordance with a result of comparison by the comparator; and an integrator that receives a residual voltage of the capacitive DAC via the common node after the comparator has performed comparison of the most significant bit to the least significant bit, integrates the received residual voltage, and sets an integrated value as a comparison reference voltage for conversion of a next analog input voltage, wherein the capacitive DAC is a split capacitive DAC, the capacitors includes a plurality of first capacitors that raise an output voltage of the capacitive DAC and a plurality of second capacitors that lower the output voltage of the capacitive DAC, in an initial state of successive approximation, the successive approximation controller connects all of the plurality of first capacitors to the second voltage and connects all of the plurality of second capacitors to the first voltage, in raising the output voltage of the capacitive DAC in successive approximation of a next bit, the successive approximation controller virtually moves a first pointer along an array direction of the plurality of first capacitors to choose first capacitors that the successive approximation controller changes from connecting to the second voltage to connecting to the first voltage, in lowering the output voltage of the capacitive DAC in the successive approximation of the next bit, the successive approximation controller virtually moves a second pointer along an array direction of the plurality of second capacitors to choose second capacitors that the successive approximation controller changes from connecting to the first voltage to connecting to the second voltage, and upon completion of successive approximation of the least significant bit, the successive approximation controller connects all of the plurality of first capacitors to the second voltage and connects all of the plurality of second capacitors to the first voltage while maintaining positions of the first and second pointers.

According to this configuration, upon completion of successive approximation of the least significant bit, the capacitive DAC is reset in a state where the positions of the first and second pointers are maintained. Therefore, the first and second pointers start moving from these positions for the next sampling. This eliminates imbalances in the use of the plurality of first and second capacitors, thus making it possible to suppress spurious without generating fixed pattern noise, even if there occur capacitance mismatches in the capacitors of the split capacitive DAC. As a result, a high-resolution AD converter can be provided.

Further, in the AD converter according to the third aspect, the successive approximation controller may determine, in accordance with the result of comparison by the comparator, whether it is necessary to raise the output voltage of the capacitive DAC.

Further, in the AD converter according to the third aspect, the successive approximation controller may move the first pointer and the second pointer in opposite directions.

According to this configuration, the first pointer and the second pointer are moved in opposite directions. Therefore, even if there are capacitance mismatches in the first and second capacitors, the spurious suppression effect can be further enhanced.

Embodiments of the present disclosure are described below with reference to the drawings. The present disclosure is not limited to the below-described embodiments. A change may be made as desired within the scope where advantages of the present disclosure are ensured. It is also possible to combine one embodiment with another embodiment. In the description below, the same references are given to the same or similar constituents.

COMPARATIVE EXAMPLE

FIG. 1 is a diagram showing a configuration of an AD converter 1000 according to a comparative example of the present disclosure. The AD converter 1000 is a noise-shaping successive approximation AD converter. The AD converter 1000 has, as a basic configuration, a successive approximation AD converter including a switch 1, a capacitive DAC 2, a comparator 3, a successive approximation controller 4, and a serial-parallel converter (SP) 5. Moreover, the AD converter 1000 further includes a low-pass filter (LPF) 6, an integrator 7, and a controller 900 in addition to the basic configuration.

The switch 1 is a switch that is used in sampling an analog input voltage Vin. When the switch 1 is brought into a conductive state, the analog input voltage Vin is inputted to the capacitive DAC 2 via a common node N10.

The capacitive DAC 2 includes a plurality of capacitors 201 to 205 having capacitances weighted by a binary ratio (power-of-two ratio). The capacitors 201 to 205 are hereinafter collectively referred to as "capacitors 200" when no particular distinction is made between them. Each of the capacitors 200 has a first end connected to the common node N10 and a second end that is selectively connected to either a reference voltage VH or a reference voltage VL. It is assumed here that the capacitances of the capacitors 201 to 205 are for example 16C, 8C, 4C, 2C, and C, respectively. In FIG. 1, the number of capacitors 200 is 5. However, this number is merely an example. The number of capacitors 200 may be N (which is an integer of 2 or larger).

Furthermore, the capacitive DAC 2 includes switches 211 to 215 corresponding to the capacitors 201 to 205. The switches 211 to 215 are hereinafter collectively referred to as "switches 210" when no particular distinction is made between them. It should be noted that in a case where the number of capacitors 200 is N, the number of switches 210 is N.

Each of the switches 210 connects the reference voltage VH (which an example of the first voltage) or the reference voltage VL (which is an example of the second voltage) to the corresponding one of the capacitors 200 in accordance with a digital input signal (which is an example of the successive approximation control signal) that is outputted from the successive approximation controller 4. For example, upon receiving a digital input signal of "1", the switch 210 connects the reference voltage VH to the corresponding capacitor 200, and upon receiving a digital input signal of "0", the switch 210 connects the reference voltage VL to the corresponding capacitor 200. The phrase "connect the reference voltage VH to the capacitor 200" refers to connecting, to the capacitor 200, a signal line to which the reference voltage VH has been applied. Further, the phrase "connect the reference voltage VL to the capacitor 200" refers to connecting, to the capacitor 200, a signal line to which the reference voltage VL has been applied. The reference voltage VH is higher than the reference voltage VL.

The comparator 3 compares an output voltage from the capacitive DAC 2 with a comparison reference voltage Vfb that is outputted from the integrator 7.

The successive approximation controller 4 determines, on the basis of a result of comparison of a target bit by the comparator 3, a digital input signal for causing the capacitive DAC 2 to generate a comparison target voltage of the next bit immediately following the target bit.

The serial-parallel converter 5 converts the result of comparison by the comparator 3 into a multibit signal. The low-pass filter (LPF) 6 allows passage of a low-frequency component of the multibit signal outputted from the serial-parallel converter 5, and causes the AD converter 1000 to function as an oversampling AD converter.

The integrator 7 receives a voltage outputted from the capacitive DAC 2, integrates the voltage thus received, and outputs the integrated value to the comparator 3.

The controller 900 brings switches 1, 71, 72, and the like into a conductive state (on) or an open state (off). The switches 1, 71, 72, and the like are switches included in the AD converter 1000 except the switches 210 of the capacitive DAC 2.

The following describes an operation of the AD converter 1000. First, the controller 900 brings the switch 1 into a conductive state and, after a certain period of time, brings the switch 1 into an open state. This allows the capacitive DAC 2 to sample the analog input voltage Vin. At this point in time, an intermediate value of a digital output code is given as an initial value to a digital input signal of the capacitive DAC 2.

In the example shown in FIG. 1, the intermediate value of the digital output code is "1, 0, 0, 0, 0", as the capacitive DAC 2 is a 5-bit capacitive DAC. With this, the comparator 3 first compares the analog input voltage Vin with a comparison target voltage of (VH−VL)/2 and determines a magnitude relationship between the voltages. Then, if Vin≥(VH−VL)/2, the comparator 3 sets the MSB to "1". On the other hand, if Vin<(VH−VL)/2, the comparator 3 sets the MSB to "0". After that, on the basis of the result of comparison by the comparator 3, the successive approximation controller 4 causes the capacitive DAC 2 to operate in a dichotomizing search and, at the same time, causes the comparator 3 to compare the analog input voltage Vin with comparison target voltages from the MSB to the LSB.

For example, if the MSB is "1", the successive approximation controller 4 outputs a digital input signal of "1, 1, 0, 0, 0" to the capacitive DAC 2 while maintaining a digital input signal of the MSB at "1". With this, the analog input voltage Vin is compared with a comparison target voltage of 3(VH−VL)/4. If Vin≥3(VH−VL)/4, the MSB-1 bit is set to "1". On the other hand, if Vin<3(VH−VL)/4, the MSB-1 bit is set to "0".

On the other hand, if the MSB is "0", the successive approximation controller 4 sets the MSB to "0" and outputs a digital input signal of "0, 1, 0, 0, 0" to the capacitive DAC 2. With this, the analog input voltage Vin is compared with a comparison target voltage of (VH−VL)/4. If Vin≥(VH−VL)/4, the next bit is set to "1". On the other hand, if Vin<(VH−VL)/4, the next bit is set to "0". Such an operation is repeated from the MSB to the LSB to determine the value of each bit. The result of comparison of each bit is outputted as a multibit AD converted value by the serial-parallel converter 5.

Figure 2:
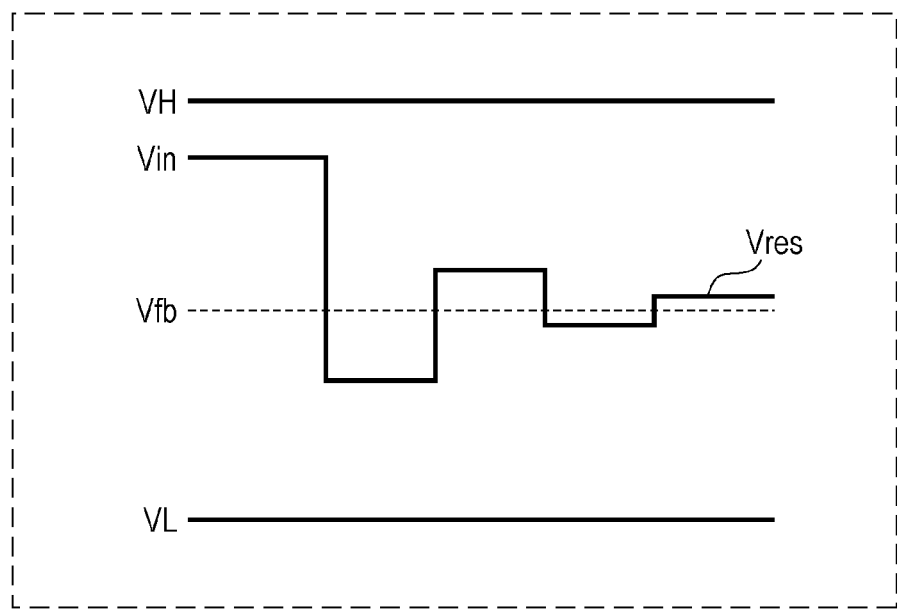
FIG. 2 is a waveform chart showing an example of changes in output voltage from a capacitive DAC during a successive approximation operation.

FIG. 2 is a waveform chart showing an example of changes in output voltage from the capacitive DAC 2 during a successive approximation operation. The successive approximation controller 4 determines a comparison target voltage of the next bit by controlling the digital input signal of the capacitive DAC 2 on the basis of the result of comparison by the comparator 3. Because of the dichotomizing search performed with the capacitive DAC 2 weighted by the binary ratio, the difference between an output signal from the capacitive DAC 2 and the comparison reference voltage Vfb becomes smaller from the MSB toward the LSB. Note here that in the case of a common successive approximation AD converter, after a process of comparison of the LSB, the capacitive DAC 2 is not controlled because a comparison of the next bit is not made.

However, the AD converter 1000 performs capacity control again on the basis of the result of comparison after the end of successive approximation of the LSB. The residual voltage Vres here is equivalent to an error resulting from quantization (i.e., quantization noise). Further, the residual voltage Vres also includes noise generated during operation of the comparator 3 (i.e., comparator noise). These noise components are sampled by the integrator 7 and, after having been integrated, are inputted as the comparison reference voltage Vfb to a comparison reference voltage terminal of the comparator 3. With this, the residual voltage Vres is added to the sampling value of the next analog input voltage Vin. By thus integrating the noise components generated during quantization and feeding back them to the next analog input voltage Vin, the AD converter 1000 can be given a noise-shaping characteristic.

Figure 3:
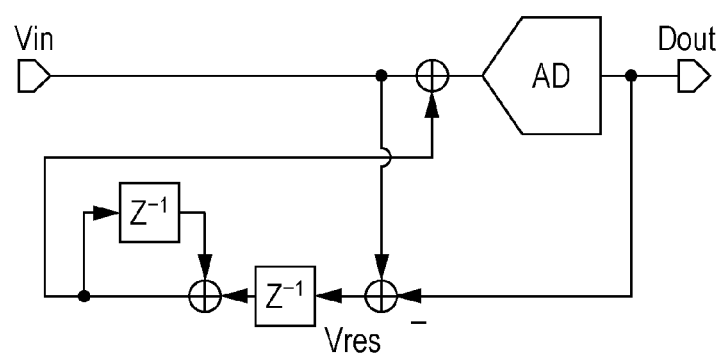
FIG. 3 is a signal-flow chart showing an operation of the AD converter shown in FIG. 1.

FIG. 3 is a signal-flow chart showing an operation of the AD converter 1000 shown in FIG. 1. The following describes the principle behind the AD converter 1000 with reference to FIG. 3. The residual voltage Vres is equal to the difference between a digital output Dout that is obtained by AD conversion and the analog input voltage Vin. The residual voltage Vres is sampled, integrated, and then fed back to the analog input voltage Vin of the next sampling.

It is assumed here that the aforementioned noise generated during quantization (i.e., the quantization noise and the comparator noise) is a noise component Q(z). Then, a transfer function between an analog input voltage Vin(z) and a digital output Dout(z) is expressed as follows:

$$D\text{out}(z) = V\text{in}(z) + (1 - Z^{-1})Q(z) \qquad \text{Formula (1)}$$

The transfer function (noise transfer function: NTF) with attention focused on the noise component Q(z) is expressed by $(1 - Z^{-1})$. This NTF exhibits such a high-pass filter characteristic that the gain of a low-frequency region is low. Therefore, Formula (1) exhibits such a characteristic as to shift the quantization noise and the comparator noise (i.e., the noise component Q(z)) toward a high-frequency region while maintaining the analog input voltage Vin(z) without change. With this, the AD converter 1000 achieves a noise-shaping characteristic. After having been shifted toward the high-frequency region, the noise component Q(z) is eliminated by the low-pass filter (LPF) 6. That is, the AD converter 1000 achieves higher resolution by increasing the SNR (signal-to-noise ratio) by sampling (i.e., oversampling) the analog input voltage Vin at a frequency that is sufficiently higher than the frequency of the analog input voltage Vin. The "frequency that is sufficiently higher than the analog input voltage Vin" corresponds to a frequency that is higher than a double of the maximum frequency included in the analog input voltage Vin. Therefore, by the controller 900 switching the switch 1 at a frequency that is sufficiently higher than the analog input voltage Vin, oversampling is achieved. It should be noted that the oversampling frequency is not limited to a particular frequency, provided it is a frequency that is at least twice as high as the maximum frequency of the analog input voltage Vin.

However, the noise-shaping characteristic of the AD converter 1000 shown in FIG. 1 is a first-order NTF, and a higher-order noise-shaping characteristic is required to achieve further higher resolution. Further, the integrator 7 uses an operational amplifier through which a stationary electric current flows. This makes an increase in power consumption unavoidable. In view of this, the present inventors propose an AD converter according to a first embodiment.

First Embodiment

Figure 4:
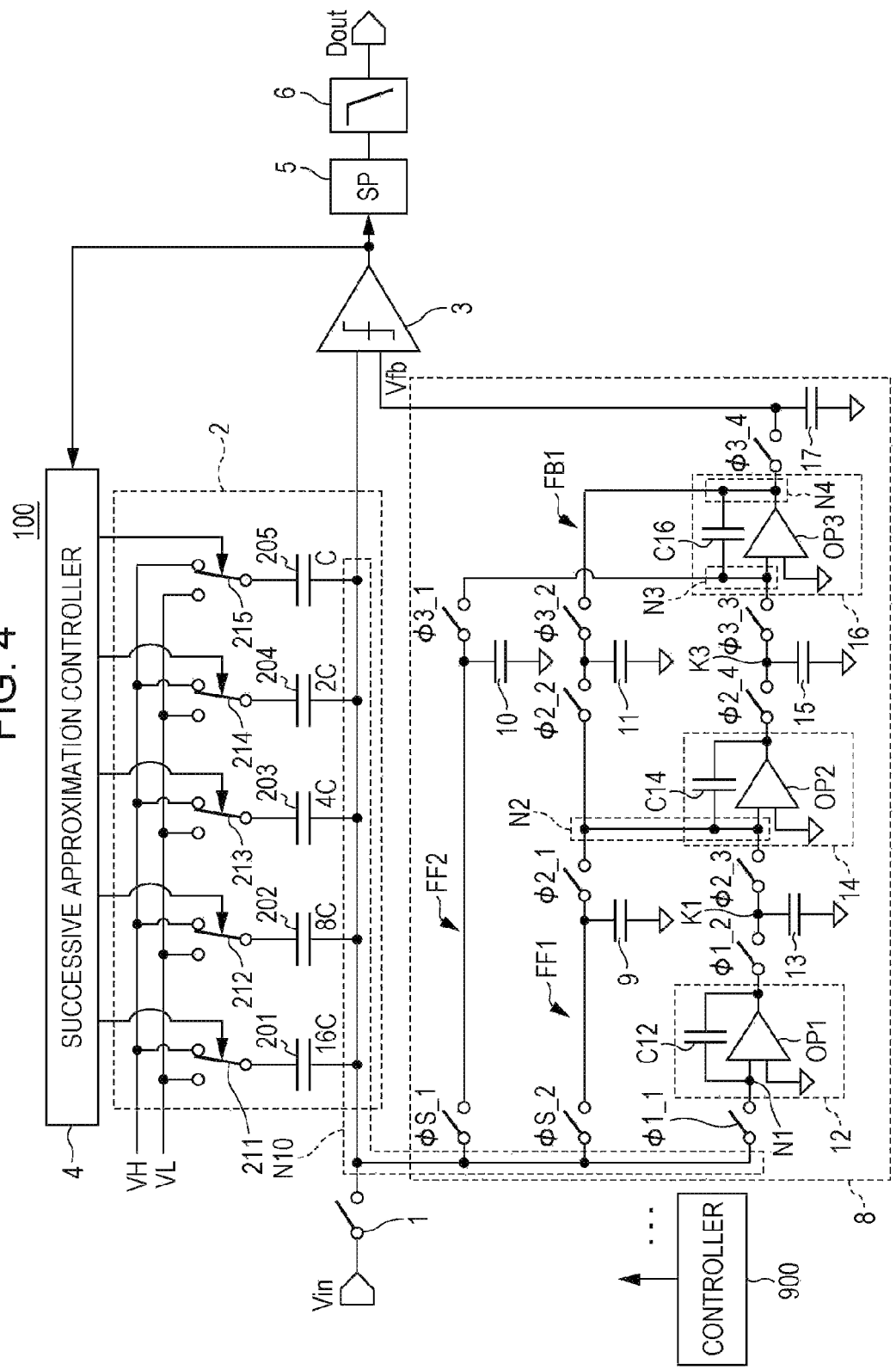
FIG. 4 is a diagram showing an example of a configuration of an AD converter according to a first embodiment of the present disclosure.

FIG. 4 is a diagram showing an example of a configuration of an AD converter 100 according to the first embodiment of the present disclosure. As with the AD converter 1000, the AD converter 100 is a noise-shaping successive approximation AD converter. Components of the AD converter 100 that are identical to those of the AD converter 1000 are given the same reference numerals, and as such, are not described below.

The AD converter 100 includes an integrator 8 instead of the integrator 7 of the AD converter 1000.

The integrator 8 includes a plurality of integrating circuits 12, 14, and 16 connected in a cascade arrangement, two feedforward paths FF1 and FF2, and a feedback path FB1.

The integrating circuit 12 is a first-stage integrating circuit and includes an operational amplifier OP1 and a capacitor C12. The integrating circuit 14 is a second-stage integrating circuit and includes an operational amplifier OP2 and a capacitor C14. The integrating circuit 16 is a third-stage integrating circuit and includes an operational amplifier OP3 and a capacitor C16.

In the integrating circuit 12, the capacitor C12 is connected between an input node N1 and an output node of the operational amplifier OP1. The other input node of the operational amplifier OP1 is grounded. The integrating circuits 14 and 16 are identical in configuration to the integrating circuit 12, and as such, are not described here.

The input node N1 of the integrating circuit 12 is connected to a common node N10 via a switch $\phi1\_1$. Further, the integrating circuit 12 is connected to the integrating circuit 14 via switches φ1_2 and φ2_3. A capacitor 13 has a first end connected to a connection point K1 between the switches φ1_2 and φ2_3 and a second end grounded.

The integrating circuit 14 is connected to the integrating circuit 16 via switches φ2_4 and φ3_3. A capacitor 15 has a first end connected to a connection point K3 between the switches φ2_4 and φ3_3 and a second end grounded.

The feedforward path FF1 is provided between the common node N10 and an input node N2 of the second-stage integrating circuit 14. A residual voltage Vres that is inputted from the common node N10 is sampled by a capacitor 9, and the residual voltage Vres thus sampled is inputted to the second-stage integrating circuit 14.

In particular, the feedforward path FF1 includes switches φs_2 and φ2_1 and the capacitor 9. A first end of the capacitor 9 is connected to the common node N10 via the switch φs_2 and connected to the input node N2 via the switch φ2_1.

The feedforward path FF2 is provided between the common node N10 and an input node N3 of the third-stage integrating circuit 16. The residual voltage Vres that is inputted from the common node N10 is sampled by a capacitor 10, and the residual voltage Vres thus sampled is inputted to the third-stage integrating circuit 16.

In particular, the feedforward path FF2 includes switches φs_1 and φ3_1 and the capacitor 10. A first end of the capacitor 10 is connected to the common node N10 via the switch φs_1 and connected to the input node N3 via the switch φ3_1.

The feedback path FB1 is provided between an output node N4 of the third-stage integrating circuit 16 and the input node N2 of the second-stage integrating circuit 14. An output voltage from the integrating circuit 16 is sampled by a capacitor 11, and is fed back to the second-stage integrating circuit 14.

In particular, the feedback path FB1 includes switches φ2_2 and φ3_2 and the capacitor 11. A first end of the capacitor 11 is connected to the input node N2 via the switch φ2_2 and connected to the output node N4 via the switch φ3_2. A second end of the capacitor 11 is grounded.

In the example shown in FIG. 4, the integrator 8 is constituted by the three integrating circuits 12, 14, and 16 connected in a cascade arrangement. However, this is merely an example. The integrator 8 may be constituted by M (which is an integer of 2 or larger) integrating circuits connected in a cascade arrangement. In this case, one or more feedforward paths are each connected to one of the second-stage to Mth-stage integrating circuits.

Figure 5:
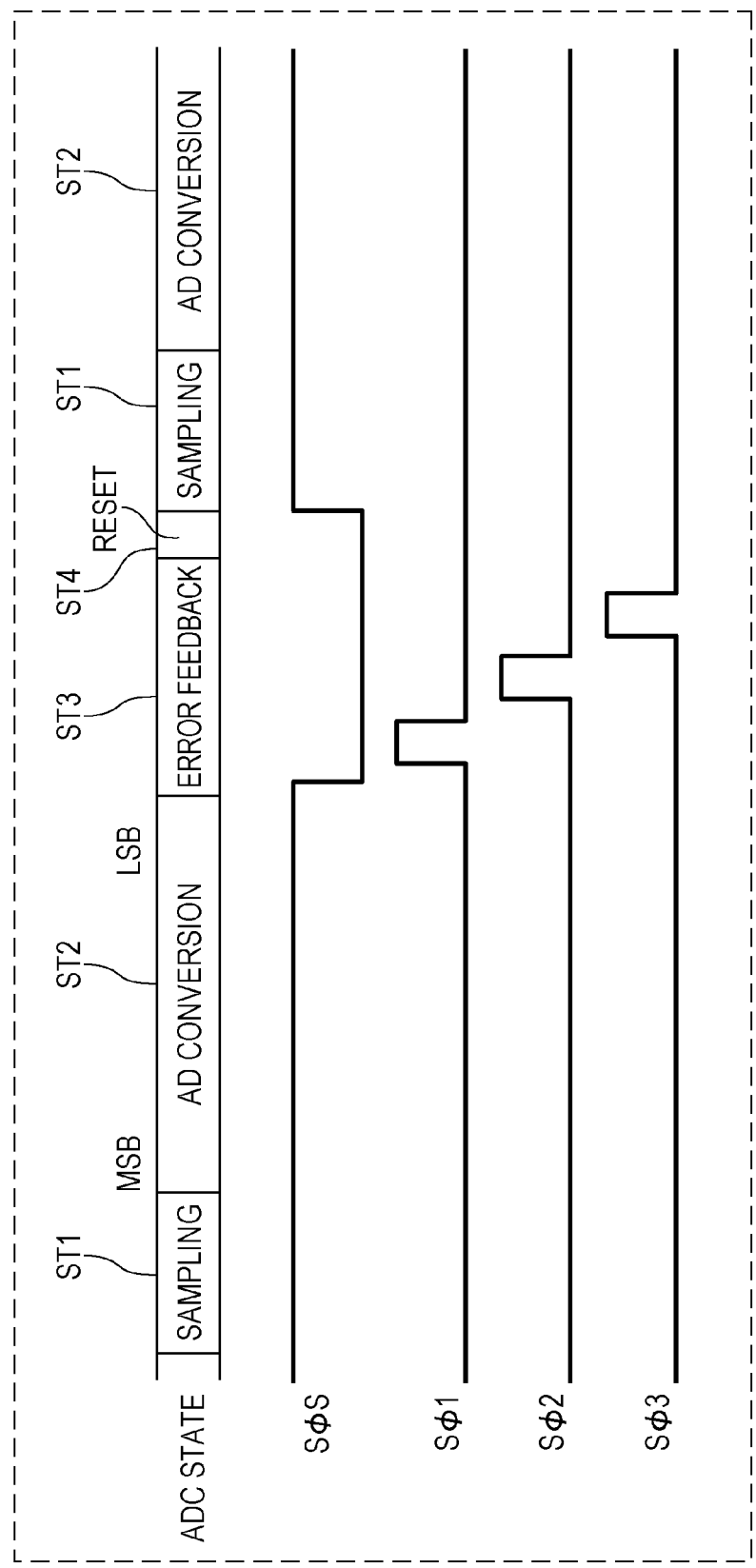
FIG. 5 shows an example of a timing diagram of an integrator shown in FIG. 4.

FIG. 5 ishows an example of a timing diagram of the integrator 8 shown in FIG. 4. The following describes a high-order noise-shaping operation that is performed by the integrator 8 with reference to FIGS. 4 and 5. In the timing diagram, the legend "ADC state" in the first line indicates an operating state of the AD converter 100. The "ADC state" is a cyclic repetition of four operating states, namely a sampling state ST1, an AD conversion state ST2, an error feedback state ST3, and a reset state ST4.

Control signals Sφs, Sφ1, Sφ2, and Sφ3 are control signals for the switches. When the control signals Sφs, Sφ1, Sφ2, and Sφ3 are high, they bring the switches into a conductive state (on). When the control signals Sφs, Sφ1, Sφ2, and Sφ3 are low, they bring the switches into an open state (off).

The control signal Sφs is a control signal for the switches φs_1 and φs_2, which are given the reference signs beginning with "φs", that the control signal Sφ1 is a control signal for the switches φ1_1 and φ1_2, which are given the reference signs beginning with "φ1", that the control signal Sφ2 is a control signal for the switches φ2_1 to φ2_4, which are given the reference signs beginning with "φ2", and that the control signal Sφ3 is a control signal for the switches φ3_1 and φ3_4, which are given the reference signs beginning with "φ3". The control signals Sφs and Sφ1 to Sφ3 are outputted from the controller 900.

The switches that are controlled by the control signal Sφs are hereinafter collectively referred to as "switches φs" when no particular distinction is made between them. The switches that are controlled by the control signal Sφ1 are hereinafter collectively referred to as "switches φ1" when no particular distinction is made between them. The switches that are controlled by the control signal Sφ2 are hereinafter collectively referred to as "switches φ2" when no particular distinction is made between them. The switches that are controlled by the control signal Sφ3 are hereinafter collectively referred to as "switches φ3" when no particular distinction is made between them.

First, in the sampling state ST1, the switch 1 is brought into a conductive state, and the analog input voltage Vin is charged to the capacitive DAC 2. When the switch 1 is turned off, the AD conversion state ST2 is started. In the AD conversion state ST2, the value of each bit from the MSB to the LSB is determined by the successive approximation controller 4, the capacitive DAC 2, and the comparator 3 so that the analog input voltage Vin is AD converted.

When the value of the LSB is determined, the error feedback state ST3 is started. The switches φs are in a conductive state during a period from the sampling state ST1 to the start of the error feedback state ST3. Therefore, at the start of the error feedback state ST3, the capacitors 9 and 10 are charged with the residual voltage Vres of the DAC 2 after the end of successive approximation down to the LSB.

In the error feedback state ST3, the switches φ1 are turned on after the switches φs have been turned off. The residual voltage Vres stored in the capacitive DAC 2 is integrated by the first-stage integrating circuit 12. The integrated value is stored in the capacitor 13. Next, the switches φ1 are turned off, and the integrated value is sampled and held by the capacitor 13. Then, the switches φ2 are turned on, and the integrated value sampled and held by the capacitor 13 is integrated by the second-stage integrating circuit 14. At this point in time, the residual voltage Vres sampled and held by the capacitor 9, too, is simultaneously inputted to the second-stage integrating circuit 14. This is how the feedforward path FF1 is achieved.

Similarly, the switches φ3 are turned on after the switches φ2 have been turned off. The integrated value of the second-stage integrating circuit 14 as sampled and held by the capacitor 15 and the residual voltage Vres sampled and held by the capacitor 10 are inputted to the third-stage integrating circuit 16.

Finally, the switches φ3 are turned off, and the integrated value of the third-stage integrating value 16 is sampled and held by the capacitor 17. This is how third-order integration is achieved. The integrated value of third-order integration sampled by the capacitor 17 is fed back as the comparison reference voltage Vfb to the comparator 3 in converting the analog input voltage Vin of the next sampling from the MSB to the LSB. This is how a successive approximation AD converter having a third-order noise-shaping characteristic is achieved.

Furthermore, when the switches φ3 are on, the feedback path FB1 causes the capacitor 11 to sample the integrated value of the third-stage integrating circuit 16. Then, when the switches φ2 are turned on in the next sampling, the feedback path FB1 feeds back the integrated value sampled by the capacitor 11 to the input node N2 of the second-stage integrating circuit 14. This makes it possible to achieve noise shaping with a further reduction in noise in the low-frequency region.

In the reset state ST4, the capacitors 201 to 205 of the capacitive DAC 2 are for example reset in preparation for AD conversion in the next sampling.

Figure 6:
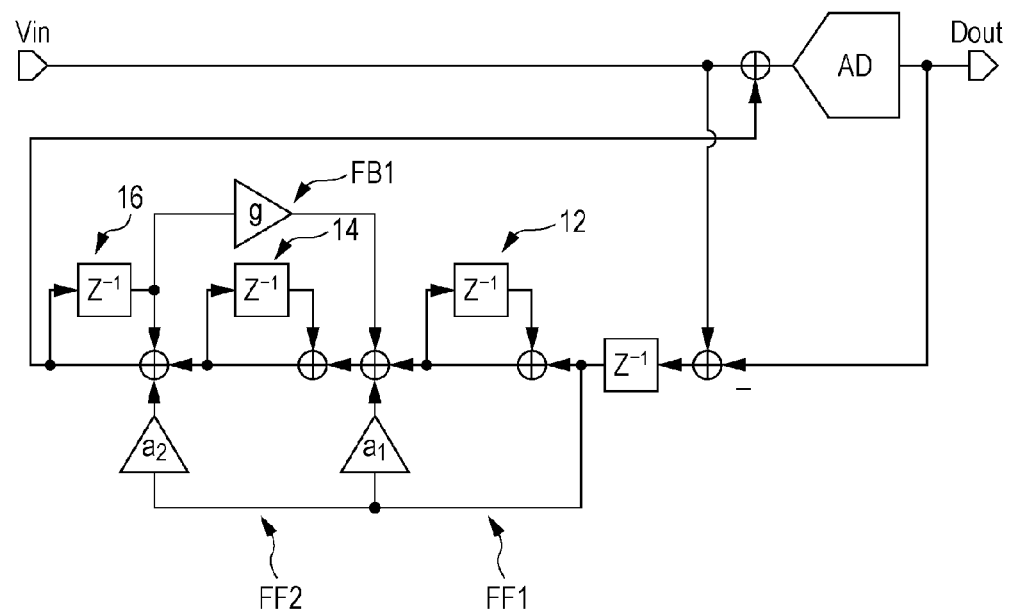
FIG. 6 is a signal-flow chart showing an operation of the AD converter shown in FIG. 4.

FIG. 6 is a signal-flow chart showing an operation of the AD converter 100 shown in FIG. 4. In the AD converter 100, the three integrating circuits 12, 14, and 16 are connected in a cascade arrangement. Further, in the AD converter 100, the feedforward path FF1 multiplies the input to the second-stage integrating circuit 14 by a coefficient a1, and the feedforward path FF2 multiplies the input to the third-stage integrating circuit 16 by a coefficient a2. In the first embodiment, the coefficients a1 and a2 are each 1. Note here that the transfer function of the AD converter 100 is expressed as follows:

$$D\text{out}(z) = V\text{in}(z) + (1-Z^{-1})^3 \times Q(z) \qquad \text{Formula (2)}$$

As shown in Formula (2), the noise transfer function with attention focused on the noise component $Q(z)$ is expressed by $(1-Z^{-1})^3$, whereby a third-order noise-shaping characteristic is achieved.

Further, in the AD converter 100, the feedback path FB1 multiplies an integrated value outputted from the third-stage integrating circuit 16 by a coefficient g and inputs the resulting value to the second-stage integrating circuit 14. This allows the NTF (noise transfer function) to have a zero point, and the coefficient g makes it possible to make a notch at the position of a specific frequency. Making a notch allows a noise reduction region to be extended to a high-frequency side, thus making it possible to extend the frequency band of the analog input voltage Vin that can be inputted to the high-frequency side.

Figure 7:
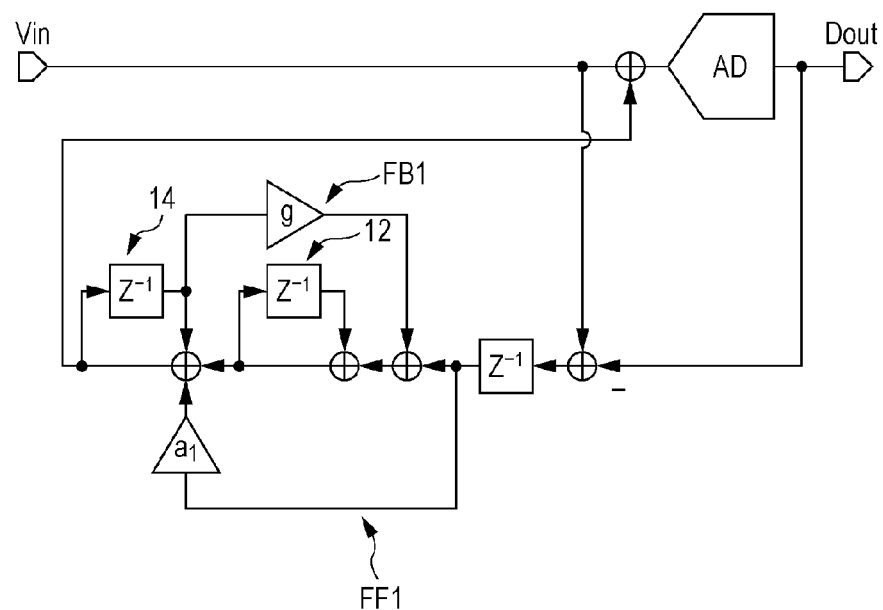
FIG. 7 is a signal-flow chart of an AD converter including an integrator having a second-order noise-shaping characteristic.

FIG. 7 is a signal-flow chart in a case that an AD converter 100 includes an integrator 8 having a second-order noise-shaping characteristic. The integrator 8, which have the second-order noise-shaping characteristic, includes two integrating circuits 12 and 14 connected in a cascade arrangement. Further, the feedforward path FF1 multiplies the input to the second-stage integrating circuit 14 by the coefficient a1. Further, the feedback path FB1 multiplies the integrated value of the second-stage integrating circuit 14 by the coefficient g and returns the resulting value to the first-stage integrating circuit 12.

Figure 8:
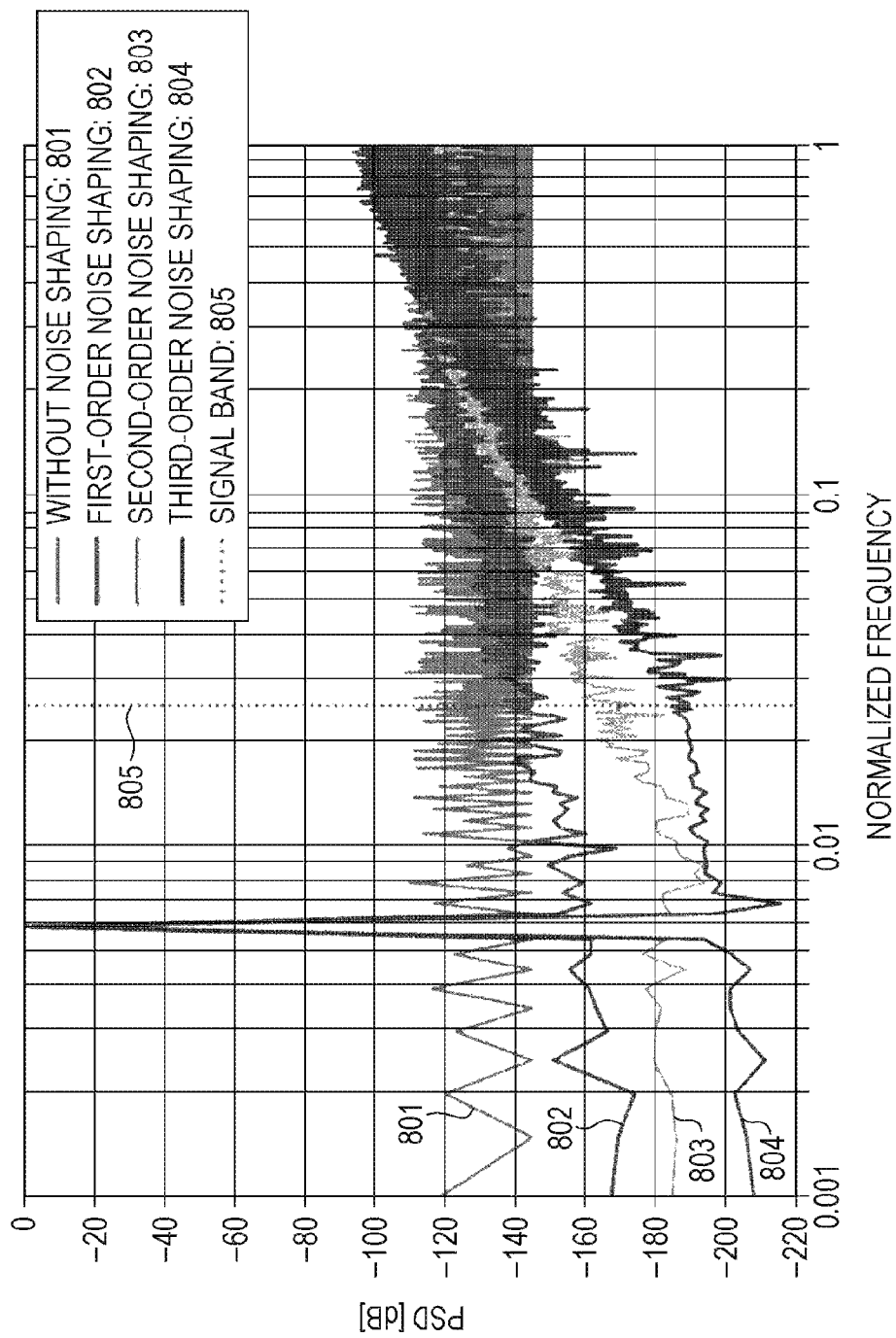
FIG. 8 is a graph showing an AD conversion output spectrum without noise shaping, an AD conversion output spectrum with first-order noise shaping, an AD conversion output spectrum with second-order noise shaping, and an AD conversion output spectrum with third-order noise shaping.

FIG. 8 is a graph showing an AD conversion output spectrum without noise shaping, an AD conversion output spectrum with first-order noise shaping, an AD conversion output spectrum with second-order noise shaping, and an AD conversion output spectrum with third-order noise shaping. In FIG. 8, the vertical axis represents the power spectral density (PSD) in decibels, and the horizontal axis represents the normalized frequency. Further, the lines 801, 802, 803, and 804 show an AD conversion output spectrum without noise shaping, an AD conversion output spectrum with first-order noise shaping, an AD conversion output spectrum with second-order noise shaping, and an AD conversion output spectrum with third-order noise shaping, respectively. Further, the dotted line 805, which is parallel to the vertical axis, indicates the upper limit of the signal band.

As the order of noise shaping increases from a first order through a second order to a third order, the PSD drops overall on the low-frequency side. This shows that the noise reduction effect is high on the low-frequency side. This in turn shows that a higher SNR can be achieved when the order of noise shaping is higher.

Figure 9:
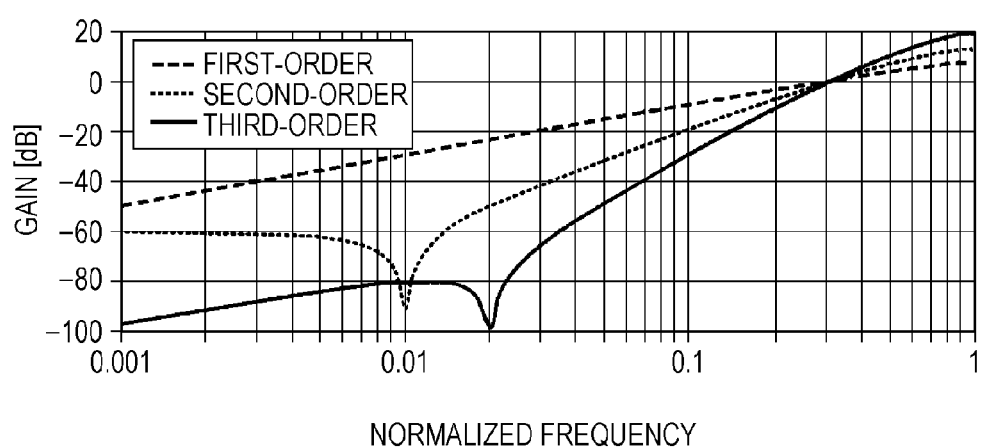
FIG. 9 is a graph showing the frequency characteristics of NTFs (noise transfer functions) with first-order, second-order, and third-order noise shaping.

FIG. 9 is a graph showing the frequency characteristics of NTFs (noise transfer functions) with first-order, second-order, and third-order noise shaping. In FIG. 9, the vertical axis represents the gain in dB, and the horizontal axis represents the normalized frequency. The zero point is shifted by using the feedback path FB1, so that the AD converter 100 can extend the band of low frequencies in which there is less noise.

Thus, the AD converter 100 according to the first embodiment uses the integrator 8 to integrate the residual voltage Vres of the capacitive DAC 2 after a successive approximation operation has been performed down to the LSB and feedback the integrated value as the comparison reference voltage Vfb for the next sampling.

First, the integrator 8 integrates the residual voltage Vres with the first-stage integrating circuit 12 and samples the residual voltage Vres with the feedforward paths FF1 and FF2. Next, the second-stage integrating circuit 14 integrates the result of first-stage integration and the residual voltage Vres sampled by the feedforward path FF1. Next, the third-stage integrating circuit 16 integrates the result of second-stage integration and the residual voltage Vres sampled by the feedforward path FF2. With this, the residual voltage Vres is given a high-order noise-shaping characteristic and added to the analog input voltage Vin that is to be sampled next, and the analog input voltage Vin is given a high-order noise-shaping characteristic. This makes it possible to provide a high-resolution successive approximation AD converter by oversampling the analog input voltage Vin.

It should be noted that the operational amplifiers OP1, OP2, and OP3, which constitute the integrating circuits 12, 14, and 16 in the first embodiment, do not need to be always in operation. Each of the operational amplifiers OP1, OP2, and OP3 needs to be in operation only during corresponding one of the periods in which integration operations are being performed. Therefore, the operational amplifiers OP1, OP2, and OP3 used in the first-stage, second-stage, and third-stage integrating circuits 12, 14, and 16 need only be in operation only during periods in which the control signals Sϕ1, Sϕ2, and Sϕ3 are on, respectively. In the case of a 10-bit successive approximation operation, a significant power reduction is possible, as the period of integration is approximately 1/20 of the entire period of AD conversion.

Specifically, the control signal Sϕ1 is inputted to the operational amplifier OP1 of the integrating circuit 12. The control signal Sϕ2 is inputted to the operational amplifier OP2 of the integrating circuit 14. The control signal Sϕ3 is inputted to the operational amplifier OP3 of the integrating circuit 16. Then, the operational amplifier OP1 needs only be in operation when the control signal Sϕ1 is high. The operational amplifier OP2 needs only be in operation when the control signal Sϕ2 is high. The operational amplifier OP3 needs only be in operation when the control signal Sϕ3 is high.

Alternatively, it is possible to achieve a third-order integrator 8 with only one operational amplifier. As mentioned above, the operational amplifiers need to be in operation only during the respective periods of integration. Therefore, it is possible to achieve first-stage, second-stage, and third-stage integration with one operational amplifier. The employment of such an operational amplifier sharing technique makes it possible to achieve a further reduction in size of the AD converter 100.

Figure 10:
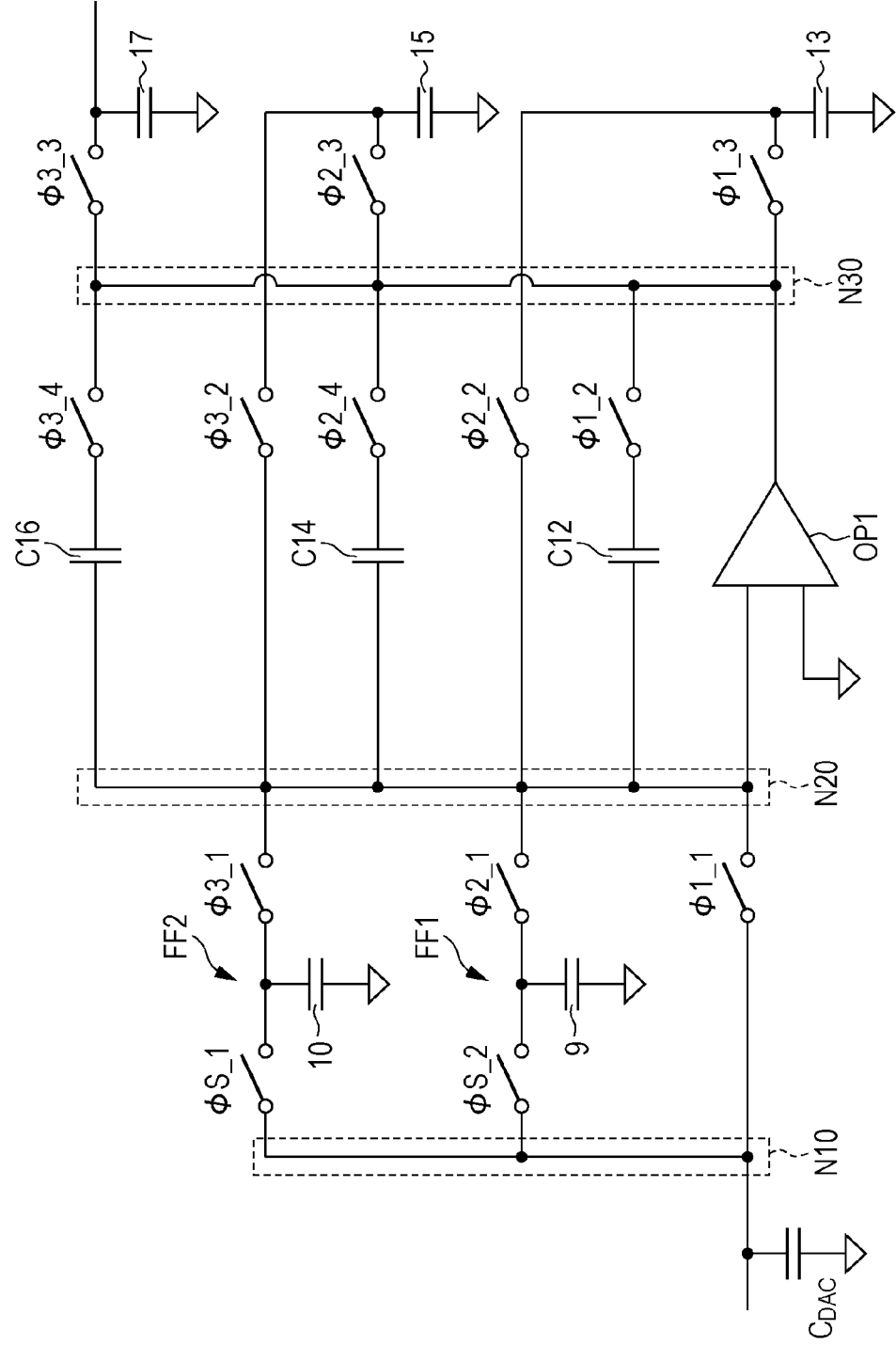
FIG. 10 is a diagram showing an example of a configuration of an integrator that performs third-order integration with one operational amplifier.

FIG. 10 is a diagram showing an example of a configuration of an integrator 8A that performs third-order integration with one operational amplifier. It should be noted that components of the integrator 8A shown in FIG. 10 that are identical to those of the integrator 8 shown in FIG. 4 are given the same reference numerals, and as such, are not described below. The integrator 8A includes an integrating circuit. The integrating circuit includes one operational amplifier OP1. The integrating circuit performs multiple stages (in the example shown in FIG. 10, three stages) of integration operation in sequence by sharing the operational amplifier OP1.

In the example shown in FIG. 10, the integrating circuit includes capacitors C12 and 13, switches φ1_1, φ1_2, and φ1_3, capacitors C14 and 15, switches φ2_2, φ2_3, and φ2_4, capacitors C16 and 17, and switches φ3_2, φ3_3, and φ3_4. The capacitors C12 and 13, and the switches φ1_1, φ1_2, and φ1_3 correspond to the first stage of integration operation. The capacitors C14 and 15, and the switches φ2_2, φ2_3, and φ2_4 correspond to the second stage of integration operation. The capacitors C16 and 17, and the switches φ3_2, φ3_3, and φ3_4 correspond to the third stage of integration operation.

Further, the integrator 8A includes a feedforward path FF1 that correspond to the second stage of integration operation and a feedforward path FF2 that correspond to the third stage of integration operation. The feedforward paths FF1 and FF2 sample the residual voltage Vres and input the residual voltage Vres thus sampled to the operational amplifier OP1 of the integrating circuit when the integrating circuit performs the second and third stages of integration operation, respectively.

The capacitor C12 and the switch φ1_2, which are serially connected, the capacitor C14 and the switch φ2_4, which are serially connected, and the capacitor C16 and the switch φ3_4, which are serially connected, are parallel connected between input and output nodes N20 and N30 of the operational amplifier OP1.

The input node N20 is connected to the common node N10 via the feedforward path FF1 and connected to the common node N10 via the feedforward path FF2. Furthermore, the input node N20 is connected to the common node N10 via the switch φ1_1.

The output node N30 is connected to the capacitor 13 via the switch φ1_3, connected to the capacitor 15 via the switch φ2_3, and connected to the capacitor 17 via the switch φ3_3.

The capacitor 13 is connected to the input node N20 via the switch φ2_2, and the capacitor 15 is connected to the input node N20 via the switch φ3_2.

The following describes an operation of the integrator 8A with reference to the timing diagram of FIG. 5. In the sampling state ST1 and the AD conversion state ST2, the switches φs are on. Therefore, when the switches φs are turned off and the error feedback state ST3 is started, the residual voltage Vres is sampled by the capacitors 9 and 10.

In the error feedback state ST3, when the switches φ1 are turned on, the capacitor C12 is connected between the input and output nodes N20 and N30 of the operational amplifier OP1. This causes the operational amplifier OP1 to constitute a first-stage integrating circuit and execute the first stage of integration operation. Further, when the switches φ1 are turned on, the input node N20 of the operational amplifier OP1 is connected to the common node N10 via the switch φ1_1, and the output node N30 of the operational amplifier OP1 is connected to the capacitor 13 via the switch φ1_3. This causes the residual voltage Vres to be integrated by the first-stage integrating circuit and causes the integrated value of the first stage of integration operation to be stored in the capacitor 13.

Next, when the switches φ1 are turned off and the switches φ2 are turned on, the capacitor C14 is connected between the input and output nodes N20 and N30 of the operational amplifier OP1. This causes the operational amplifier OP1 to constitute a second-stage integrating circuit and execute the second stage of integration operation. At this point in time, the input node N20 is connected to the capacitor 9 via the feedforward path FF1 and connected to the capacitor 13 via the switch φ2_2, and the output node N30 is connected to the capacitor 15 via the switch φ2_3. Therefore, the integrated value of the first stage of integration operation as sampled by the capacitor 13 and the residual voltage Vres sampled by the capacitor 9 are integrated by the second stage of integration operation, and the resulting integrated value is stored in the capacitor 15.

Next, when the switches φ2 are turned off and the switches φ3 are turned on, the capacitor C16 is connected between the input and output nodes N20 and N30 of the operational amplifier OP1. This causes the operational amplifier OP1 to constitute a third-stage integrating circuit and execute the third stage of integration operation. At this point in time, the input node N20 is connected to the capacitor 10 via the feedforward path FF2 and connected to the capacitor 15 via the switch φ3_2, and the output node N30 is connected to the capacitor 17 via the switch φ3_3. Therefore, the integrated value of the second stage of integration operation as sampled by the capacitor 15 and the residual voltage Vres sampled by the capacitor 10 are integrated by the third stage of integration operation, and the resulting integrated value is stored in the capacitor 17.

Then, the integrated value stored in the capacitor 17 is inputted to the comparator 3 as the comparison reference voltage Vfb for the next sampling.

Thus, the employment of the integrator 8A makes it possible to achieve a reduction in circuit size, as the number of operational amplifiers OP1 needs only be 1.

Second Embodiment

Figure 11:
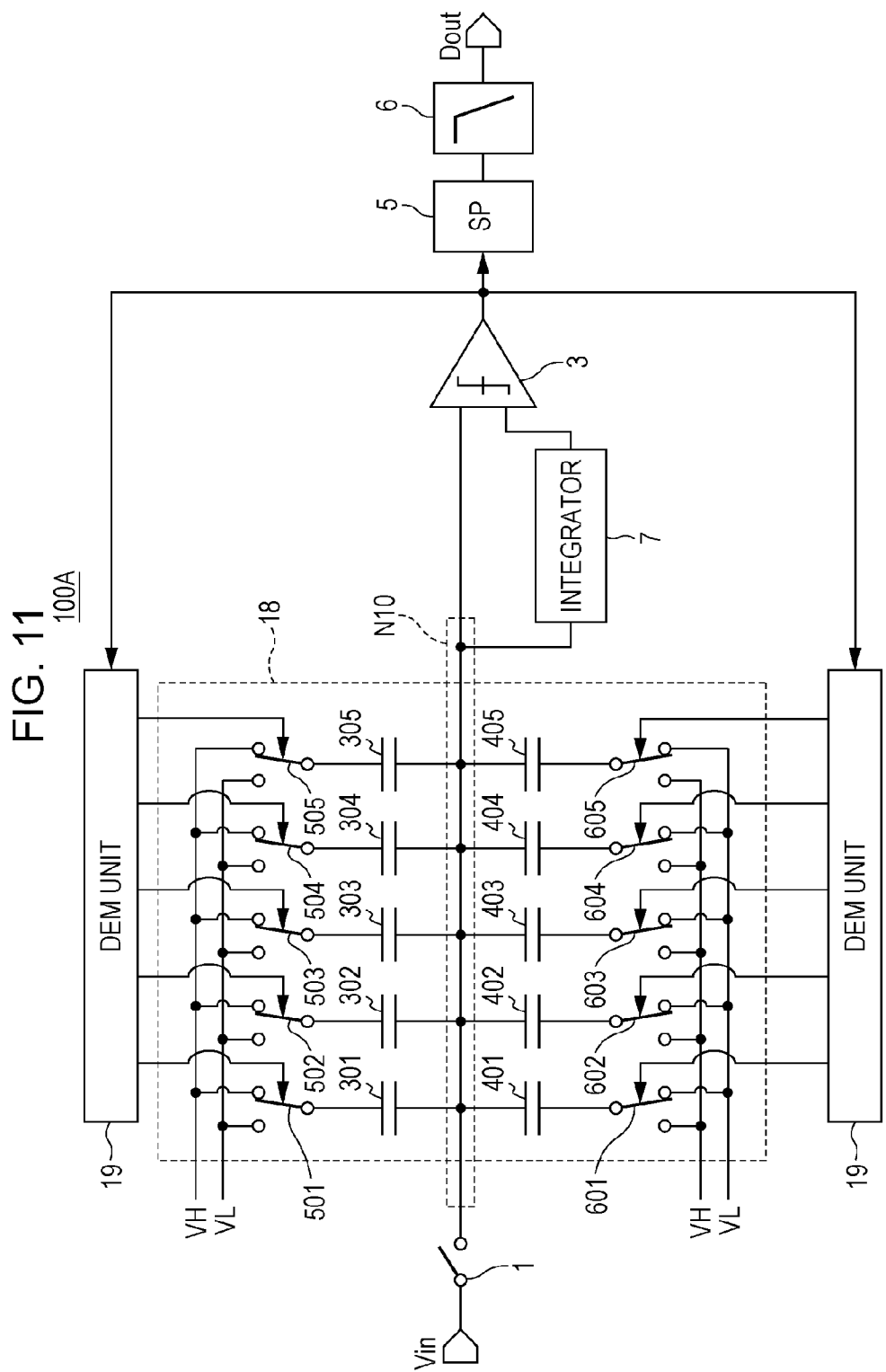
FIG. 11 is a diagram showing an example of a configuration of an AD converter according to a second embodiment of the present disclosure.

FIG. 11 is a diagram showing an example of a configuration of an AD converter 100A according to a second embodiment of the present disclosure. As with the AD converter 100, the AD converter 100A is a noise-shaping successive approximation AD converter. Components of the AD converter 100A that are identical to those of the AD converter 1000 are given the same reference numerals, and as such, are not described below.

The AD converter 100A includes a split capacitive DAC 18 instead of the capacitive DAC 2 of the AD converter 1000 shown in FIG. 1. Further, although the integrator 7 is illustrated on the right side of the split capacitive DAC 18, the integrator 7 is electrically identical to the integrator 7 of the AD converter 1000, as the integrator 7 has its input terminal connected to the common node N10.

The split capacitive DAC 18 includes capacitors 301 to 305 for raising the output voltage of the split capacitive DAC 108 and capacitors 401 to 405 for lowering the output voltage.

A first end of each of the capacitors 301 to 305 and a first end of each of the capacitors 401 to 405 are connected to each other via the common node N10. Further, a second end of each of the capacitors 301 to 305 is connected to the reference voltage VH or the reference voltage VL, and a second end of each of the capacitors 401 to 405 is connected to the reference voltage VH or the reference voltage VL.

Furthermore, the split capacitive DAC 18 is controlled by using a DEM (dynamic element matching) unit 19. The DEM unit 19 serves to suppress the spurious of an output signal by dynamically using the capacitors of the split capacitive DAC 18 properly at random or in accordance with the analog input voltage Vin depending on the purposes when there occur variations in the capacitors. It should be noted that the DEM unit 19 is an example of a successive approximation controller.

The capacitors 301 to 305 are hereinafter collectively referred to as "capacitors 300" when no particular distinction is made between them. Further, the capacitors 401 to 405 are hereinafter collectively referred to as "capacitors 400" when no particular distinction is made between them. Note here that the capacitors 301 to 305 and the capacitors 401 to 405 have the same capacitance. In this example, five capacitors 300 and five capacitors 400 are provided. This example is for illustrative purposes only. N (which is an integer of 2 or larger) capacitors 300 and N (which is an integer of 2 or larger) capacitors 400 may be provided. Further, the capacitors 300 are an example of the second capacitors, and the capacitors 400 are an example of the first capacitors.

Switches 501 to 505 correspond to the capacitors 301 to 305, and switches 601 to 605 correspond to the capacitors 401 to 405. The switches 501 to 505 are hereinafter collectively referred to as "switches 500" when no particular distinction is made between them. The switches 601 to 605 are hereinafter collectively referred to as "switches 600" when no particular distinction is made between them.

Figure 12:
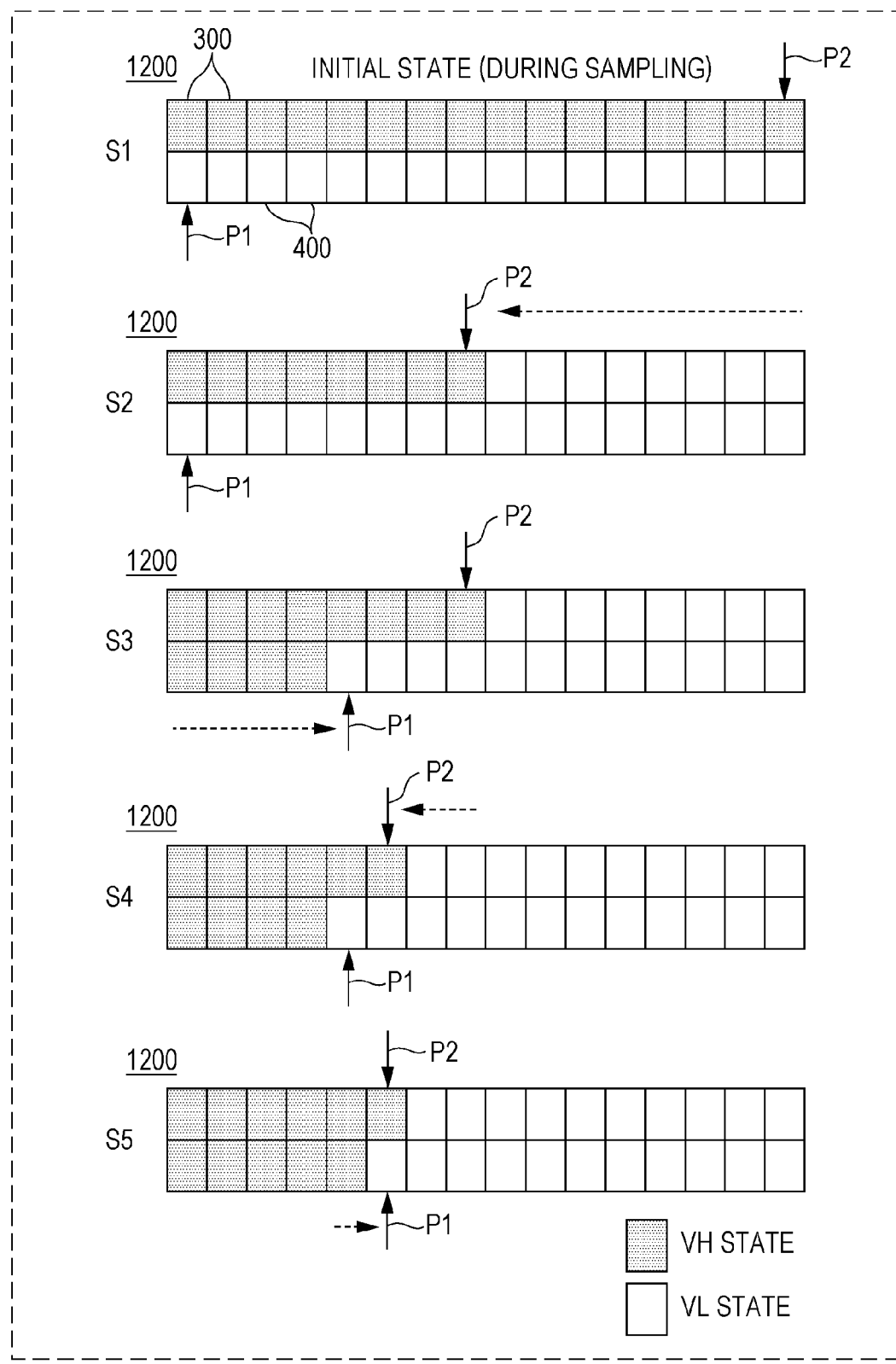
FIG. 12 is an explanatory diagram of an operation of a split capacitive DAC.
Figure 13:
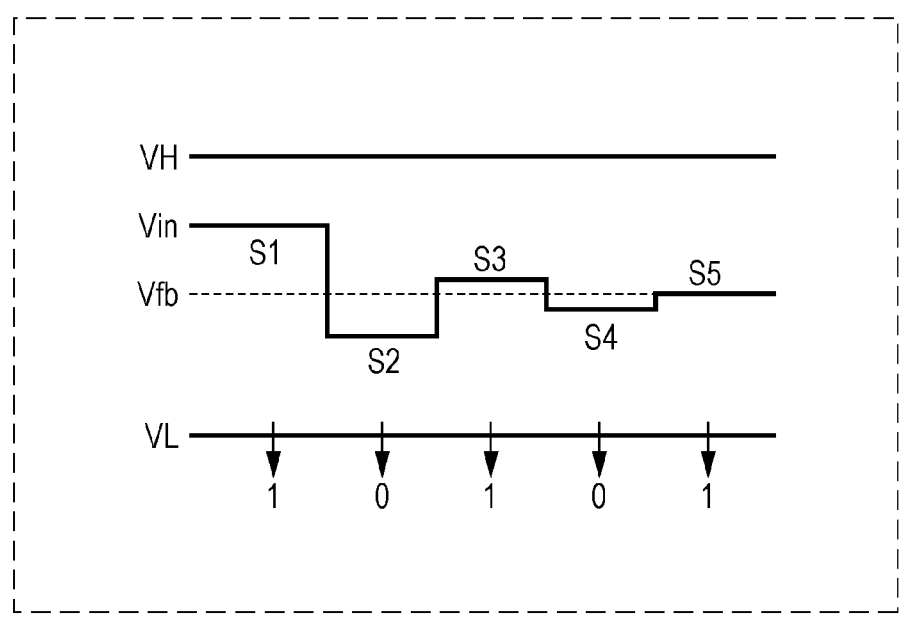
FIG. 13 is a waveform chart showing changes in output voltage from the split capacitive DAC.

FIG. 12 is an explanatory diagram of an operation of the split capacitive DAC 18. FIG. 13 is a waveform chart showing changes in output voltage (i.e., the analog input voltage Vin) from the split capacitive DAC 18. The following describes the operation of the split capacitive DAC 18 wit reference to FIGS. 12 and 13. Here, in the example shown in FIG. 12, the operation of the split capacitive DAC 18 in a case where the number of capacitors is 32 is described.

A capacitance map 1200 conceptually shows an arrangement of capacitors 300 and 400. In the first row, sixteen capacitors 300 are mapped, and in the second row, sixteen capacitors 400 are mapped. In the capacitance map 1200, the capacitors 300 are mapped, for example, so that the square in the first row and the first column indicates the first capacitor 300 from the left and the square in the first row and the second column indicates the second capacitor 300 from the left. That is, the square in the $P^{th}$ row and the first column indicates the $P^{th}$ capacitor 300 from the left, where P is an integer equal to or more than 1 and equal to or less than 16.

Further, in the capacitance map 1200, the capacitors 400 are mapped, for example, so that the square in the second row and the first column indicates the first capacitor 400 from the left and the square in the second row and the second column indicates the second capacitor 400 from the left. That is, the square in the $Q^{th}$ row and the second column indicates the $Q^{th}$ capacitor 400 from the left, where Q is an integer equal to or more than 1 and equal to or less than 16.

A pointer P1 (which is an example of the first pointer) points to a positon in a capacitor 400, and a pointer P2 (which is an example of the second pointer) points to a positon in a capacitor 300. In an initial state of successive approximation, the pointer P1 is positioned on the extreme left, and the pointer P2 is positioned on the extreme right.

Further, in the capacitance map 1200, the reference voltage VH is connected to those of the capacitors 300 and 400 which correspond to the gray squares. Further, the reference voltage VL is connected to those of the capacitors 300 and 400 which correspond to the white squares.

As mentioned above, in sampling the analog input voltage Vin, the initial value of the capacitive DAC 2 is the intermediate value of the digital output code.

Therefore, in step S1, which is the initial state of successive approximation, the DEM unit 19 causes the second end (i.e., a terminal opposite to the common node N10) of each of the upper-half sixteen capacitors 300 to be connected to the reference voltage VH and causes the second end (i.e., a terminal opposite to the common node N10) of each of the lower-half sixteen capacitors 400 to be connected to the reference voltage VL.

After the switch 1 is open, the DEM unit 19 makes changes in output voltage from the split capacitive DAC 18 in accordance with the result of comparison by the comparator 3. In changing the output voltage (Vin) in a positive direction, the DEM unit 19 moves the pointer P1 rightward to change from connecting the capacitors 400 to the reference voltage VL to connecting the capacitors 400 to the reference voltage VH. On the other hand, in changing the output voltage (Vin) in a negative direction, the DEM unit 19 moves the pointer P2 leftward to change from connecting the capacitors 300 to the reference voltage VH to connecting the capacitors 300 to the reference voltage VL.

In the example shown in FIG. 13, in step S1, the DEM unit 19 sets the MSB to "1" and determines to lower the output voltage (Vin) in the successive approximation of the MSB-1 bit, as the output voltage (Vin) is equal to or higher than the reference voltage Vfb. Therefore, as shown in step S2 of FIG. 12, the DEM unit 19 moves the pointer P2 leftward by eight squares and then positions the pointer P2 at the ninth capacitor 300 from the right. Then, the DEM unit 19 changes from connecting the eight capacitors 300, by which the pointer P2 has passed, to the reference voltage VH to connecting the eight capacitors 300 to the reference voltage VL.

This causes the output voltage (Vin) to change by −(VH−VL)/4. In step S2, as shown in FIG. 13, the DEM unit 19 sets the MSB-1 bit to "0" and determines to raise the output voltage (Vin) in the successive approximation of the MSB-2 bit, as the output voltage (Vin) is lower than the reference voltage Vfb. Therefore, as shown in step S3 of FIG. 12, the DEM unit 19 moves the pointer P1 rightward by four squares and then positions the pointer P1 at the fifth capacitor 400 from the left. Then, the DEM unit 19 changes from connecting the four capacitors 400, by which the pointer P1 has passed, to the reference voltage VL to connecting the four capacitors 400 to the reference voltage VH. This causes the output voltage (Vin) to change by +(VH−VL)/8.

In subsequent steps S4 and S5, the DEM unit 19 repeats changes in the output voltage (Vin) until the end of successive approximation of the LSB while moving the pointers P1 and P2 through similar operations. After the end of successive approximation of the LSB, the DEM unit 19 resets the initial value of the split capacitive DAC 18 in preparation for the next sampling of the analog input voltage Vin. At this point in time, the DEM unit 19 connects all of the upper-half capacitors 300 to the reference voltage VH, connects all of the lower-half capacitors 400 to the reference voltage VL, and resets the split capacitive DAC 18, but does not reset the positions of the pointers P1 and P2.

Assuming that step S5 of FIG. 12 indicates the end of successive approximation of the LSB, the pointers P1 and P2 start moving from these positions for the next sampling.

Therefore, after the switch 1 has been opened, the operation of the pointers P1 and P2 with respect to the capacitors 300 and 400 is started from the final positions of the pointers P1 and P2 in the previous sampling. This makes it possible to suppress spurious without generating fixed pattern noise, even if there occur mismatches of capacitances in the capacitors 300 and 400 of the split capacitive DAC 18.

Furthermore, the pointer operation depending on the analog input voltage Vin makes it possible to give a first-order noise-shaping characteristic to the noise caused by the capacitance mismatches.

In the capacitance map 1200, the leftmost capacitor 300 and the rightmost capacitor 300 are continuous with each other, and the leftmost capacitor 400 and the rightmost capacitor 400 are continuous with each other. Therefore, upon arrival at the rightmost capacitor 400, the pointer P1 is moved rightward continuously from the leftmost capacitor 400. Further, upon arrival at the leftmost capacitor 300, the pointer P2 is moved leftward continuously from the rightmost capacitor 300.

Figure 14:
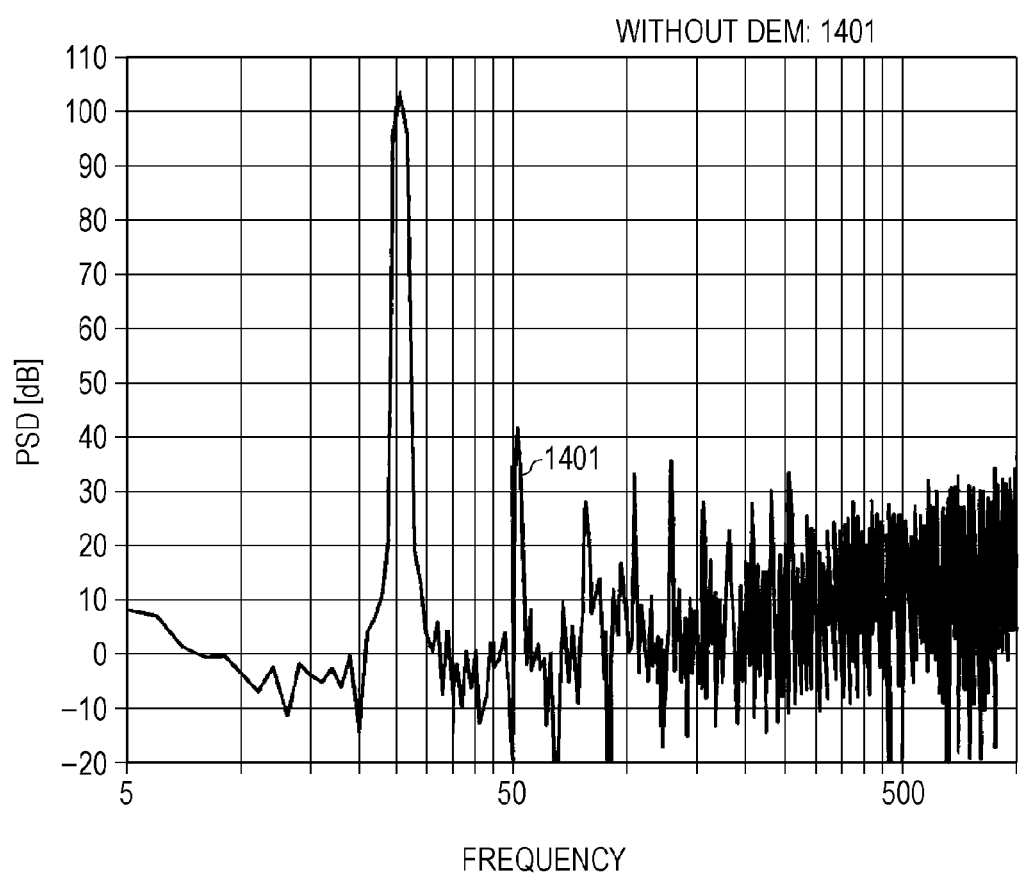
FIG. 14 is a graph showing an example of a power spectrum without the employment of DEM.
Figure 15:
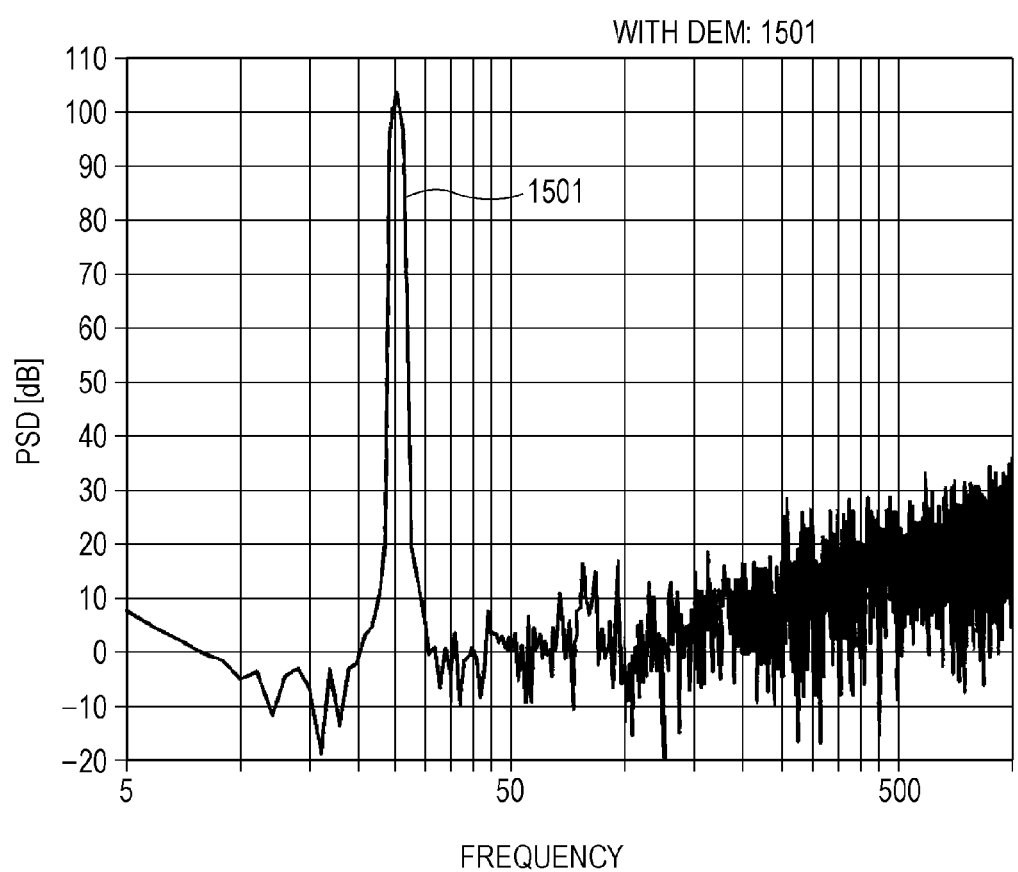
FIG. 15 is a graph showing an example of a power spectrum of the AD converter according to the second embodiment of the present disclosure with the employment of DEM.

FIG. 14 is a graph showing an example of a power spectrum without the employment of DEM. FIG. 15 is a graph showing an example of a power spectrum of the AD converter 100A according to the second embodiment of the present disclosure with the employment of DEM. In each of FIGS. 14 and 15, the vertical axis represents the power spectral density (PSD) in decibels, and the horizontal axis represents the frequency.

In this simulation, the spectrum of an output signal from the capacitive DAC is calculated, with a capacitive mismatch given as 1σ=1%. A comparison between the graph 1401 and the graph 1501 shows that the use of DEM suppresses plural occurrences of spurious that are generated by the capacitance mismatch.

Modifications (1) In FIG. 4, the two feedforward paths FF1 and FF2 are provided. Alternatively, either of the feedforward paths may be omitted, as a high-order noise-shaping characteristic can be obtained with at least one feedforward path. Further, in a case where the integrator 8 is constituted by N (which is an integer of 2 or larger) integrating circuits, one or more feedforward paths are connected to one or more of the second to $N^{th}$ integrating circuits.

(2) In FIG. 4, the feedback path FB1 is provided. Alternatively, the feedback path FB1 may be omitted. Further, in FIG. 10, the feedback path FB1 is not provided. Alternatively, the feedback path FB1 including switches φ2_2 and φ3_2 and the capacitor 11 may be provided in the integrator 8A. In this case, the feedback path FB1 is provided between the output node N30 and the input node N20. That is, the first end of the feedback path FB1 is connected to the output node N30 and the second end of the feedback path FB1 is connected to the input node N20.

(3) In FIG. 11, the first-order integrator 7 is used. Alternatively, the integrator 8 or 8A may be used.

(4) In FIG. 10, the integrator 8A is constituted by using one operational amplifier OP1. Alternatively, an integrator may be constituted by using a plurality of operational amplifiers.

In the present disclosure, all or some of the functional blocks of the block diagrams shown in FIGS. 4 and 11 may be executed by one or more electronic circuits including a semiconductor device, a semiconductor integrated circuit (IC), or an LSI (large-scale integration). The LSI or the IC may be integrated into one chip or may be constituted by a combination of a plurality of chips. For example, the functional blocks other than the memory elements may be integrated into one chip. The LSI and the IC are herein called as such. However, they may be given different names depending on their degrees of integration. For example, they may be called a system LSI, a VLSI (very large scale integration), or an ULSI (ultra large scale integration). A field programmable gate array (FPGA) that is programmed after manufacturing of the LSI or a reconfigurable logic device that can set up the reconfiguration of junction relationships inside the LSI or the plotting of circuits inside the LSI can be used for the same purposes.

Furthermore, the functions or operations of all or some of the functional blocks of the block diagrams shown in FIGS. 4 and 11 may be executed by software processing. In this case, the software is stored in one or more non-transitory storage media such as ROMs, optical disks, or hard disk drives, and in a case where the software is executed by a processor, the software causes the processor and a peripheral device to execute a specific function in the software. A system or an apparatus may include one or more non-transitory storage media in which the software is stored, a processor, and a needed hardware device such as an interface.

An AD converter according to the present disclosure is capable of high-resolution AD conversion while maintaining low power consumption, and as such, is useful as an AD converter that is used at an analog front end of a sensor in mobile use.

What is claimed is:

1. An AD converter for converting an analogue input voltage into a digital value including a most significant bit to a least significant bit, the AD converter comprising:
a common node to which the analog input voltage is inputted;
a capacitive DAC including capacitors each having a first end connected to the common node and a second end that is selectively connected to either a first or second voltage in accordance with a successive approximation control signal for a bit of the digital value;
a comparator that compares a voltage of the common node with a comparison reference voltage to determine the bit;
a successive approximation controller that determines a successive approximation control signal for a next bit in accordance with a result of comparison by the comparator; and
an integrator that receives a residual voltage of the capacitive DAC via the common node after a the comparator has performed comparison of the most significant bit to the least significant bit, integrates the received residual voltage, and sets an integrated value as a next comparison reference voltage for conversion of a next analog input voltage, wherein:
the common node is coupled to a first input of the comparator and an output of the integrator is coupled to a second input of the comparator, and
the integrator includes:
first to $X^{th}$ integrating circuits connected in a cascade arrangement, where X is an integer greater than or equal to two, and
at least one feedforward path that each samples the residual voltage and outputs the sampled residual voltage to one of the second to $X^{th}$ integrating circuits.

2. The AD converter according to claim 1, wherein the integrator further includes at least one feedback path that each feeds back an integrated value of one of second to $X^{th}$ integrating circuits to a preceding integrating circuit.

3. The AD converter according to claim 1, wherein each of the integrating circuits includes an operational amplifier that is activated only during integration operations.

4. An AD converter for converting an analogue input voltage into a digital value including a most significant bit to a least significant bit, the AD converter comprising:

a common node to which the analog input voltage is inputted;

a capacitive DAC including capacitors each having a first end connected to the common node and a second end that is selectively connected to either a first or second voltage in accordance with a successive approximation control signal for a bit of the digital value;

a comparator that compares a voltage of the common node with a comparison reference voltage to determine the bit;

a successive approximation controller that determines a successive approximation control signal for a next bit in accordance with a result of comparison by the comparator; and an integrator that receives a residual voltage of the capacitive DAC via the common node after the comparator has performed comparison of the most significant bit to the least significant bit, integrates the received residual voltage, and sets an integrated value as a next comparison reference voltage for conversion of a next analog input voltage, wherein:

the common node is coupled to a first input of the comparator and an output of the integrator is coupled to a second input of the comparator, and the integrator includes:

an integrating circuit that includes an operational amplifier and performs first to $X^{th}$ stages of an integration operation by sharing the integration circuit, where X is an integer greater than or equal to two, and at least one feedforward path that each samples the residual voltage and outputs the sampled residual voltage to the integrating circuit when the integrating circuit performs one of the second to $X^{th}$ stages of the integration operation.

5. The AD converter according to claim 4, wherein the integrator includes a feedback path that feeds back the integrated value of a first integration operation to the integrating circuit when the integrating circuit performs a second integration operation immediately following the first integration operation.

6. The AD converter according to claim 4, wherein the operation amplifier is activated only during integration operations.

7. An AD converter for converting an analogue input voltage into a digital value including a most significant bit to a least significant bit, the AD converter comprising:

a common node to which the analog input voltage is inputted;

a capacitive DAC including capacitors each having a first end connected to the common node and a second end that is selectively connected to either a first or second voltage in accordance with a successive approximation control signal for a bit of the digital value, the second voltage being lower than the first voltage;

a comparator that compares a voltage of the common node with a comparison reference voltage to determine the bit;

a successive approximation controller that determines a successive approximation control signal for a next bit in accordance with a result of comparison by the comparator; and an integrator that receives a residual voltage of the capacitive DAC via the common node after the comparator has performed comparison of the most significant bit to the least significant bit, integrates the received residual voltage, and sets an integrated value as a comparison reference voltage for conversion of a next analog input voltage, wherein the capacitive DAC is a split capacitive DAC, the capacitors includes a plurality of first capacitors that raise an output voltage of the capacitive DAC and a plurality of second capacitors that lower the output voltage of the capacitive DAC, in an initial state of successive approximation, the successive approximation controller connects all of the plurality of first capacitors to the second voltage and connects all of the plurality of second capacitors to the first voltage, in raising the output voltage of the capacitive DAC in successive approximation of a next bit, the successive approximation controller virtually moves a first pointer along an array direction of the plurality of first capacitors to choose first capacitors that the successive approximation controller changes from connecting to the second voltage to connecting to the first voltage, in lowering the output voltage of the capacitive DAC in the successive approximation of the next bit, the successive approximation controller virtually moves a second pointer along an array direction of the plurality of second capacitors to choose second capacitors that the successive approximation controller changes from connecting to the first voltage to connecting to the second voltage, and upon completion of successive approximation of the least significant bit, the successive approximation controller connects all of the plurality of first capacitors to the second voltage and connects all of the plurality of second capacitors to the first voltage while maintaining positions of the first and second pointers.

8. The AD converter according to claim 7, wherein the successive approximation controller determines, in accordance with the result of comparison by the comparator, whether it is necessary to raise the output voltage of the capacitive DAC.

9. The AD converter according to claim 8, wherein the successive approximation controller moves the first pointer and the second pointer in opposite directions.

* * * * *